(12) United States Patent
Deng et al.

(10) Patent No.: US 9,583,631 B1
(45) Date of Patent: Feb. 28, 2017

(54) TRANSISTORS WITH UNIFORM DENSITY OF POLY SILICON

(71) Applicant: VIA Alliance Semiconductor Co., Ltd., Shanghai (CN)

(72) Inventors: Jade Deng, Shanghai (CN); Keith Ma, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/072,710

(22) Filed: Mar. 17, 2016

(30) Foreign Application Priority Data

Dec. 4, 2015 (CN) .......................... 2015 1 0885222

(51) Int. Cl.
*H03M 1/00* (2006.01)
*H01L 29/786* (2006.01)
*H03M 7/16* (2006.01)
*H03M 1/66* (2006.01)

(52) U.S. Cl.
CPC ........ *H01L 29/78675* (2013.01); *H03M 1/66* (2013.01); *H03M 7/165* (2013.01)

(58) Field of Classification Search
CPC ............. H01L 2924/1306; H01L 27/11; H01L 21/845; H01L 27/11807; H01L 29/4975
USPC ........ 341/136, 144, 145; 257/355, 499, 369, 257/E21.499, E23.145
See application file for complete search history.

(56) References Cited

U.S. PATENT DOCUMENTS

| 5,892,471 | A | * | 4/1999 | Mahant-Shetti | .... H01L 27/0207 341/135 |
| 5,949,362 | A | | 9/1999 | Tesch et al. | |
| 6,008,747 | A | * | 12/1999 | Iida | ..................... H03M 1/0648 323/315 |
| 6,072,413 | A | * | 6/2000 | Hirasawa | .............. H03M 1/745 341/118 |
| 6,100,833 | A | | 8/2000 | Park | |
| 6,236,346 | B1 | * | 5/2001 | Schofield | ............ H03M 1/0648 341/144 |
| 6,710,405 | B2 | | 3/2004 | Zommer et al. | |
| 7,439,894 | B2 | | 10/2008 | Peng et al. | |
| 8,298,875 | B1 | * | 10/2012 | Or-Bach | ............. H01L 29/4236 257/E21.411 |
| 9,196,663 | B2 | * | 11/2015 | Yamazaki | ........... H01L 27/3244 |
| 2006/0102967 | A1 | * | 5/2006 | Kamigaki | .......... G11C 16/0475 257/390 |
| 2008/0079461 | A1 | * | 4/2008 | Lin | .................... H01L 21/76816 326/80 |

(Continued)

FOREIGN PATENT DOCUMENTS

TW       200807890       2/2008

OTHER PUBLICATIONS

Non-Final Office Action mailed Oct. 31, 2016, issued in U.S. Appl. No. 15/160,755 (copy not provided).

(Continued)

*Primary Examiner* — Linh Nguyen
(74) *Attorney, Agent, or Firm* — McClure, Qualey & Rodack, LLP

(57) ABSTRACT

A transistor with uniform density of poly silicon includes a gate terminal, a drain terminal, and a source terminal. The gate terminal is constructed by a plurality of separated poly silicon, such that the density of the poly silicon is uniform.

12 Claims, 6 Drawing Sheets

(56) References Cited

U.S. PATENT DOCUMENTS

2010/0246152 A1* 9/2010 Lin ..................... H01L 21/563
                                                    361/783

OTHER PUBLICATIONS

Chinese language office action dated Dec. 6, 2016, issued in application No. TW 105108411.
Polgreen, T.L., et al.; "Improving the ESD failure threshold of shielded n-MOS output transistors by ensuring uniform current flow;" IEEE Transactions on Electron Devices; vol. 39; No. 2; Feb. 1992; pp. 379-388.

* cited by examiner

TRANSISTORS WITH UNIFORM DENSITY OF POLY SILICON

CROSS REFERENCE TO RELATED APPLICATIONS

This Application claims priority of China Patent Application No. 201510885222.0, filed on Dec. 4, 2015, the entirety of which is incorporated by reference herein.

BACKGROUND OF THE INVENTION

Field of the Invention

The disclosure relates generally to transistors, and more particularly it relates to layout methods of the transistors.

Description of the Related Art

In designing integrated circuits, the functions of the transistors are extremely important. If it is possible to improve the performance of the transistors, the overall performance of the integrated circuits could be significantly improved.

BRIEF SUMMARY OF THE INVENTION

For solving the problems above, the invention provides transistors with uniform density of poly silicon.

In an embodiment, a transistor with uniform density of poly silicon comprises a gate terminal, a drain terminal, and a source terminal. The gate terminal is constructed of a plurality of separated poly silicon, such that the density of the poly silicon is uniform.

In an embodiment, a current source device comprises a plurality of current source units, a plurality of least significant bits, and a plurality of most significant bits. The current source units are arranged along a plurality of rows and a plurality of columns of a current source array. Each of the current source units comprises a first amount of sub-units. Each of the sub-units comprises a second amount of first-type transistors. The first-type transistors are coupled in series with each other and the sub-units are coupled in parallel with each other. Each of the least significant bits comprises a third amount of current source units. Each of the most significant bits comprises a fourth amount of current source units. The fourth amount is the third amount multiplied by a positive integer. Each of the current source units is constructed of a fifth amount of first-type transistors, such that the poly silicon density of the first-type transistor is uniform to reduce an influence of a gradient in the poly silicon density of the current source units and to increase the output impedance of each of the current source units.

According to an embodiment of the current source device, the fifth amount is the first amount multiplied by the second amount.

According to an embodiment of the current source device, the least significant bits are placed at a geometric center of the current source array. Two adjacent bits in the most significant bits are centrally symmetric to the geometric center.

According to an embodiment of the current source device, the current source array comprises a first symmetry axis through the geometric center, each of the most significant bits is divided into two parts, and the two parts are symmetric to the first symmetry axis.

According to an embodiment of the current source device, the current source array further comprises a second symmetry axis through the geometric center. The second symmetry axis is orthogonal to the first symmetry axis and divides the current source array into a first region and a second region. One of the two adjacent bits in the most significant bits is placed in one of the first region and the second region, and the other of the two adjacent bits in the most significant bits is placed in the other of the first region and the second region.

According to an embodiment of the current source device, the most significant bits are divided into a plurality of odd bits and a plurality of even bits. The odd bits are in the first region, and the even bits are in the second region.

According to an embodiment of the current source device, each of the most significant bits is divided into a first part and a second part. The first part and the second part are respectively placed in either side of the first symmetry axis.

According to an embodiment of the current source device, a first odd bit of the odd bits is adjacent to a first even bit of the even bits. When the first part and the second part of the first odd bit are coupled on the first symmetry axis and placed in the first region, the first part and the second part of the first even bit are separated from the first symmetry axis and placed in the second region.

According to another embodiment of the current source device, a first odd bit of the odd bits is adjacent to a first even bit of the even bits. When the first part and the second part of the first odd bit are separated from the first symmetry axis and placed in the first region, the first part and the second part of the first even bit are coupled on the first axis and placed in the second region.

According to an embodiment of the current source device, the first symmetry axis stretches along the direction of the rows, and the second symmetric axis stretches along the direction of the columns.

According to another embodiment of the current source device, the first symmetry axis stretches along the direction of the columns, and the second symmetric axis stretches along the direction of the rows.

According to an embodiment of the current source device, the current source array comprises N bits of thermometer codes and M bits of binary codes, wherein the positive integer is $(2^M-1)$, the amount of least significant bits is $(2^M-1)$, the amount of most significant bits is $(2^N-1)$, wherein the least significant bit and a plurality of dummy current source units form a least significant bit array placed in the geometric center, wherein the two adjacent bits in the most significant bits are centrally symmetric to the least significant bit array.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
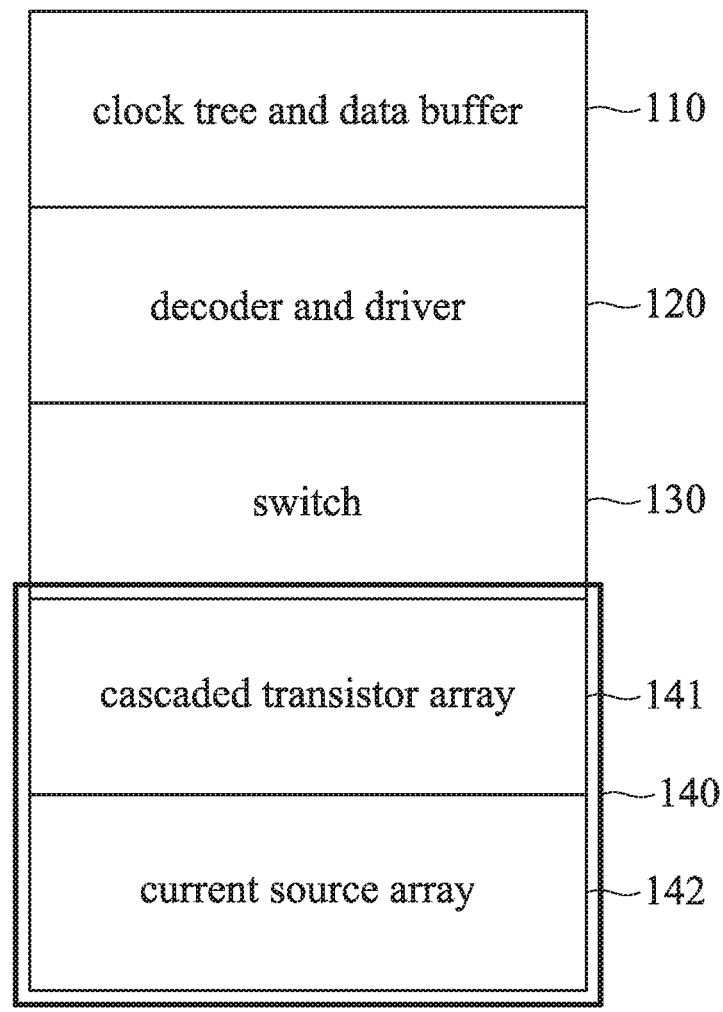
FIG. 1 is a floor plan of a current-steering digital-to-analog converter in accordance with an embodiment of the invention.

FIG. 1 is a floor plan of a current-steering digital-to-analog converter in accordance with an embodiment of the invention. As shown in FIG. 1, the current-steering digital-to-analog converter 100 includes the clock tree and data buffer 110, the decoder and driver 120, the switch 130, and the cascode current source array 140. The clock tree and data buffer 110 is configured to synchronize the input digital data with the clock and to improve the driving capability of the input digital data.

The decoder and driver 120 is configured to decode the input digital data to be the decoded data and to drive the switch 130 according to the decoded data. According to an embodiment of the invention, the decoder and driver 120 is configured to convert part of or all of the input digital data from being in binary code into being in thermometer code, and then to drive the switch 130.

The switch 130 controls the direction of the current according to the control of the decoder and driver 120. The cascode current source array 140 includes the cascaded transistor array 141 and the current source array 142, in which a cascode current source unit of the cascode current source array 140 is constructed by a cascaded transistor of the cascaded transistor array 141 integrated with a current source unit of the current source array 142.

According to an embodiment of the invention, the current-steering digital-to-analog converter 100 is an X-bit digital-to-analog converter, and the cascode current source array 140 includes $2^X$ cascode current source units. In other words, the cascaded transistor array 141 includes $2^X$ cascaded transistors, the current source array 142 includes $2^X$ current source units, and the switch 130 includes $2^{X+1}$ switch units. A 10-bit digital-to-analog converter is illustrated herein to describe the layout of the current source array 142 in detail.

Figure 2:
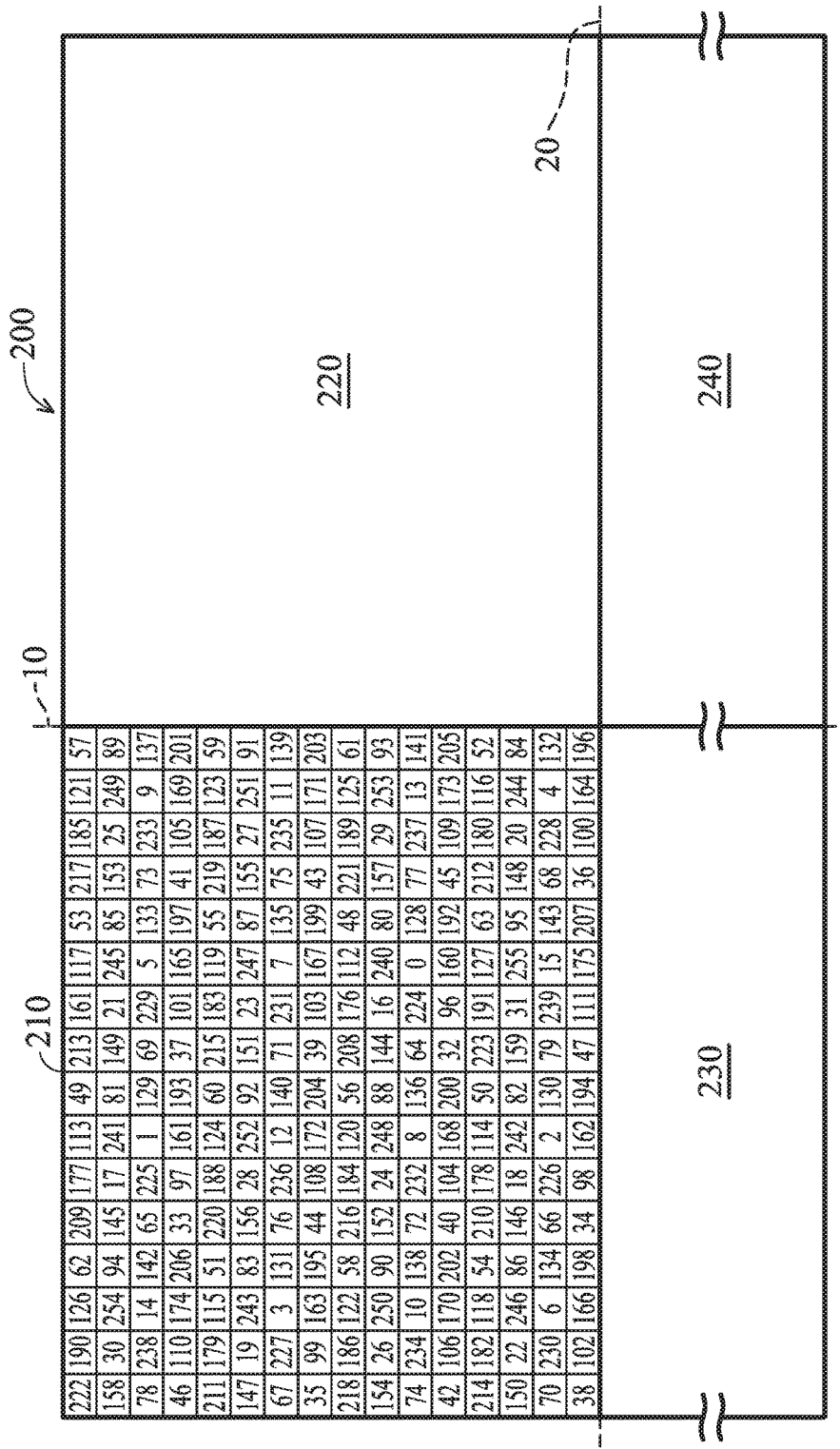
FIG. 2 is a circuit layout diagram of a current source array in accordance with an embodiment of the invention.

FIG. 2 is a circuit layout diagram of a current source array in accordance with an embodiment of the invention. As shown in FIG. 2, the current source array 200 is divided into the first part 210, the second part 220, the third part 230, and the fourth part 240 by the first axis 10 and the second axis 20. The first part 210 and the second part 220 are respectively axisymmetric to the third part 230 and the fourth part 240 relative to the second axis 20. The first part 210 and the third part 230 are respectively axisymmetric to the second part 220 and the fourth part 240 relative to the first axis 10. According to an embodiment of the invention, the first axis 10 and the second axis 20 are orthogonal.

According to an embodiment of the invention, the first part 210 is divided into 256 current source units which are represented by numbers from 0 to 255. A number of 0 means that the current source unit is the least significant bit (LSB), and a number of 255 means that the current source unit is the most significant bit (MSB). Since the first part 210, the second part 220, the third part 230, and the fourth part 240 are axially symmetric to the first axis 10 and the second axis 20, the current source units with a number of 0 and a number of 255 should be found in the second part 220, the third part 230, and the fourth part 240 as well, in which the current source units with a number of 0 and those with a number of 255 in the first part 210, the second part 220, the third part 230, and the fourth part 240 are individually symmetric, related to the first axis 10 and the second axis 20.

In other words, the current source unit from the least significant bit to the most significant bit are equally divided into four parts which are separated into the first part 210, the second part 220, the third part 230, and the fourth part 240 in a way that is axially symmetric to the first axis 10 and the second axis 20. According to an embodiment of the invention, the current source array 200 is the current source array of the 10-bit digital-to-analog converter, in which the current source array 200 is divided into four parts, each of which includes 256 current source units. That is, the current source array 200 includes 1024 current source units. According to an embodiment of the invention, the least significant bit has at least one current source unit, and the number of current source units constructing the least significant bit may be determined by the designer.

As shown in FIG. 2, since each of the bits, from the least significant bit to the most significant bit, is divided into 4 parts separated among the first part 210, the second part 220, the third part 230, and the fourth part 240. The least significant bit is illustrated herein. Since the current source unit with number of 0, which is separated among the first part 210, the second part 220, the third part 230, and the fourth part 240, should be coupled together by the wire, the complexity of routing the wire could be increased. Since the wire routing is too complex to occupy a large area, such that a substantial parasitic capacitance is produced. The operation speed of the circuit should be lowered.

Figure 3:
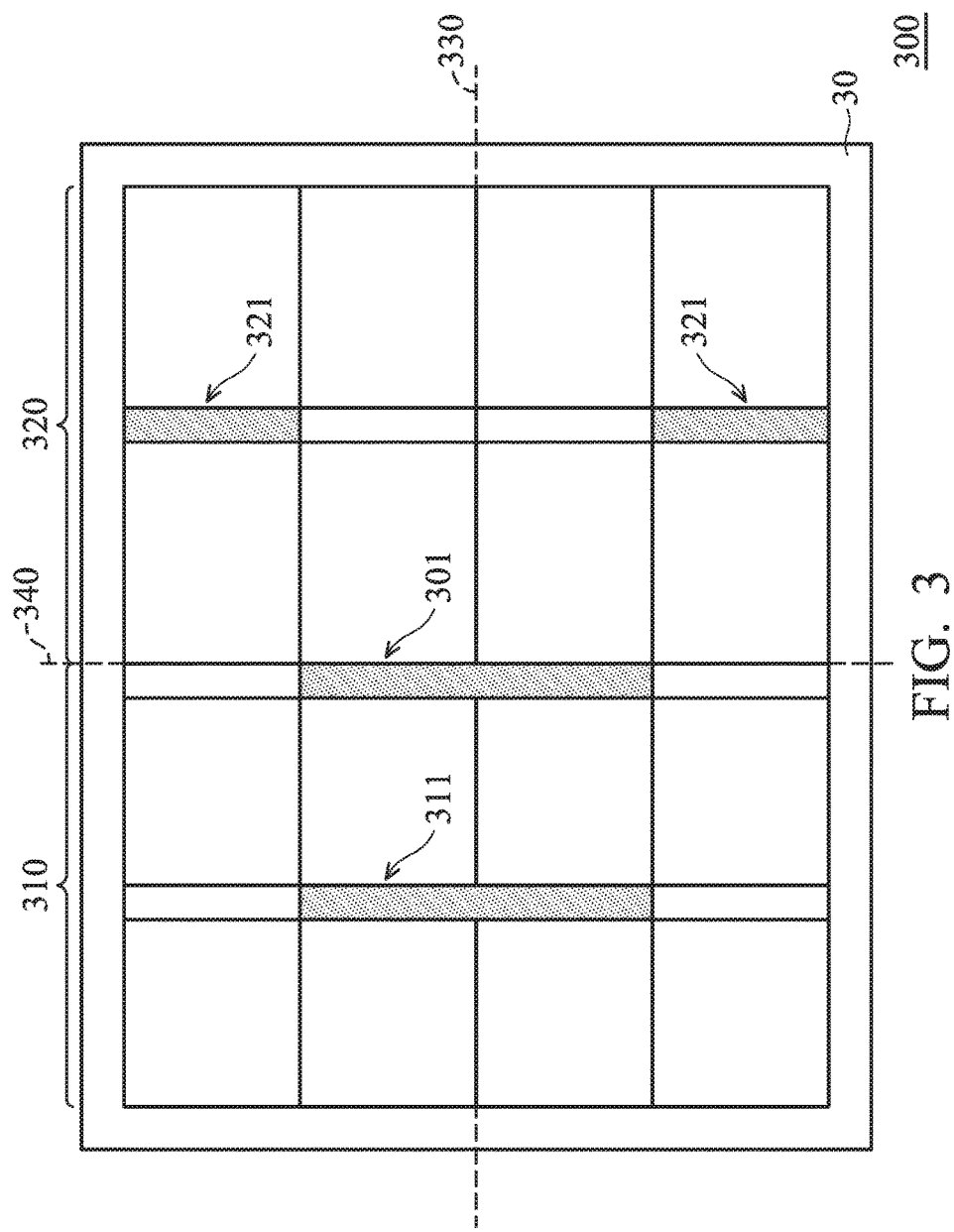
FIG. 3 is a circuit layout diagram of a current source array in accordance with another embodiment of the invention.

FIG. 3 is a circuit layout diagram of a current source array in accordance with another embodiment of the invention. As shown in FIG. 3, the current source array 300 includes the dummy cells 30, a plurality of the least significant bits 301, the first region 310, the first most significant bit 311, the second region 320, and the second most significant bit 321, in which the second symmetry axis 340 divides the current source array 300 into the first region 310 and the second region 320. The current source units are arranged in a plurality of columns and a plurality of rows of the current source array 300, in which the rows are horizontal and the columns are vertical. The first symmetry axis 330 is along the direction of the rows, and the second symmetry axis 340 is along the direction of the columns.

According to an embodiment of the invention, the outer layer of the current source array 300 is surrounded by the dummy cells 30 for reducing the influence of the stress caused by the gradient in the poly silicon density. According to another embodiment of the invention, the dummy cells 30 are not necessary employed in the current source array 300. According to an embodiment of the invention, the first symmetry axis 330 and the second symmetry axis 340 may be randomly rotated based on the geometric center, in which the first symmetry axis 330 and the second symmetry axis 340 are orthogonal to each other.

According to an embodiment of the invention, the least significant bits 301 are placed near the geometric center of the current source array 300, and the least significant bits 301 are symmetric to the first symmetry axis 330. According to an embodiment of the invention, the least significant bits 301 may be placed in either the first region 310 or the second region 320. According to other embodiments of the invention, when the least significant bits 301 are placed at the geometric center of the current source array 300, the least significant bits 301 and the second symmetry axis 340 are overlapped. In addition, the dummy cells are employed, so that there are an identical amount of current source units in the first region 310 and the second region 320.

According to an embodiment of the invention, the even bits of the most significant bits are placed in the first region 310, and the odd bits of the most significant bits are placed in the second region 320, in which the least significant bits 301 belong to the even bits and are also placed in the first region 310. According to another embodiment of the invention, the even bits of the most significant bits are placed in the second region 320, the odd bits of the most significant bits are placed in the first region 310, in which the least significant bits 301 belong to the even bits and are also placed in the second region 320. According to other embodiments of the invention, the least significant bits 301 do not belong to the first region 310 and the second region 320, and the dummy cells are employed to make the amount of odd bits equal to that of the even bits.

According to an embodiment of the invention, the first most significant bit 311 and the second most significant bit 321 are two adjacent bits. The first most significant bit 311 and the second most significant bit 321 are individually symmetric to the first symmetry axis 330. In addition, the first most significant bit 311 and the second most significant bit 321 are centrally symmetric to the geometric center of the current source array 300. According to an embodiment of the invention, the first most significant bit 311 and the second most significant bit 321 respectively belong to different odd bits and even bits.

In order to simplify the illustration, a 10-bit digital-to-analog converter is illustrated in the following description, but not limited thereto, for explaining in detail, in which the 10 bits includes 6 bits of thermometer codes for controlling the most significant bits and 4 bits of binary codes for controlling the least significant bits.

Figure 4:
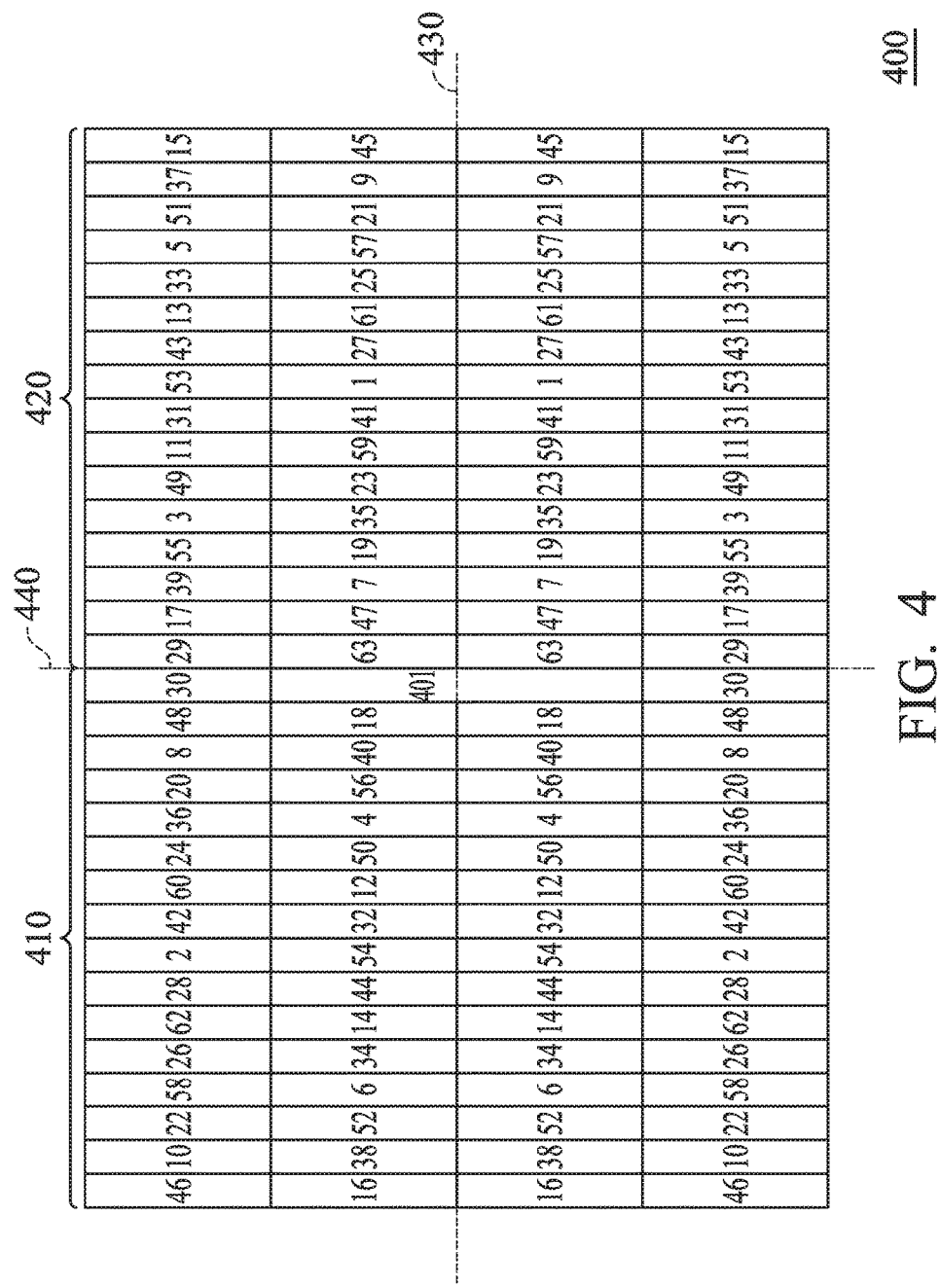
FIG. 4 is a circuit layout diagram of a current source array of a 10-bit digital-to-analog converter in accordance with an embodiment of the invention.

FIG. 4 is a circuit layout diagram of a current source array of a 10-bit digital-to-analog converter in accordance with an embodiment of the invention. According to the embodiments of the invention, the digital-to-analog converter includes N-bit of thermometer codes and M-bit of binary codes, so that the digital-to-analog converter includes ($2^M-1$) least significant bits and ($2^N-1$) most significant bits.

According to an embodiment of the invention, the 10-bit digital-to-analog converter includes 6 bits of the thermometer codes and 4 bits of the binary codes, in which the 6-bit thermometer codes are configured to control the most significant bits and the 4-bit binary codes are configured to the least significant bits. According to an embodiment of the invention, the least significant bit is constructed by a current source unit, such that the least significant bits 401 in FIG. 4 includes 15 current source units controlled by the 4-bit binary codes and 1 dummy cell. That is, the least significant bits 401 include 16 current source units, in which one of the current source units is a dummy cell.

Since 6-bit thermometer codes are configured to control the most significant bits, the current source array 400 includes ($2^6-1=63$) most significant bits, in which each of the most significant bits is represented by a number between 1 and 63. In addition, each of the most significant bits includes 16 current source units and occupies the same layout area as the least significant bits 401. In other words, the current source array 400 includes (64*16=1024) current source units in total, in which a dummy cell is included in the 1024 current source units.

As shown in FIG. 4, the second symmetry axis 440 divides the current source array 400 into the first region 410 and the second region 420. According to an embodiment of the invention, the least significant bits 401 are placed near the geometric center of the current source array 400, and the least significant bits 401 belong to the first region 410. According to another embodiment of the invention, when the least significant bits 401 are placed at the geometric center, the least significant bits 401 are placed on the second symmetry axis 440. The dummy cell may be employed, so that the first region 310 and the second region 320 have the same amount of current source units.

The most significant bits with numbers 45 and 46 are illustrated herein. Since a number of 45 and a number of 46 respectively represent the $45^{th}$ most significant bit and the $46^{th}$ most significant bit, the most significant bits with numbers 45 and 46 are two adjacent bits in the most significant bits. As shown in FIG. 4, the most significant bits with numbers 45 and 46 are both divided into 2 parts and individually symmetric to the first symmetry axis 430. In addition, the most significant bits with numbers 45 and 46 are centrally symmetric to the geometric center of the current source array 400 which is the intersection of the first symmetry axis 430 and the second symmetry axis 440.

According to an embodiment of the invention, except for the least significant bits 401, each of the most significant bits in the current source array 400 is divided into 2 parts at most. Comparing to the current source array 200 in FIG. 2 which is divided into 4 parts, the routing complexity and the routing area of the current source array 400 are greatly reduced, so that the parasitic capacitance due to the routing area is reduced. Therefore, the current source array 400 is able to operate in a higher operation speed.

In addition, two adjacent bits in the most significant bits are centrally symmetric (i.e., two adjacent odd bit and even bit are centrally symmetric) and each bit is axially symmetric, such that the process gradients is reduced and so is the influence caused by the gradient in the poly silicon density. In addition, the influence of the thermal gradient may be lowered, such that the performance of the digital-to-analog converter is improved.

Figure 5:
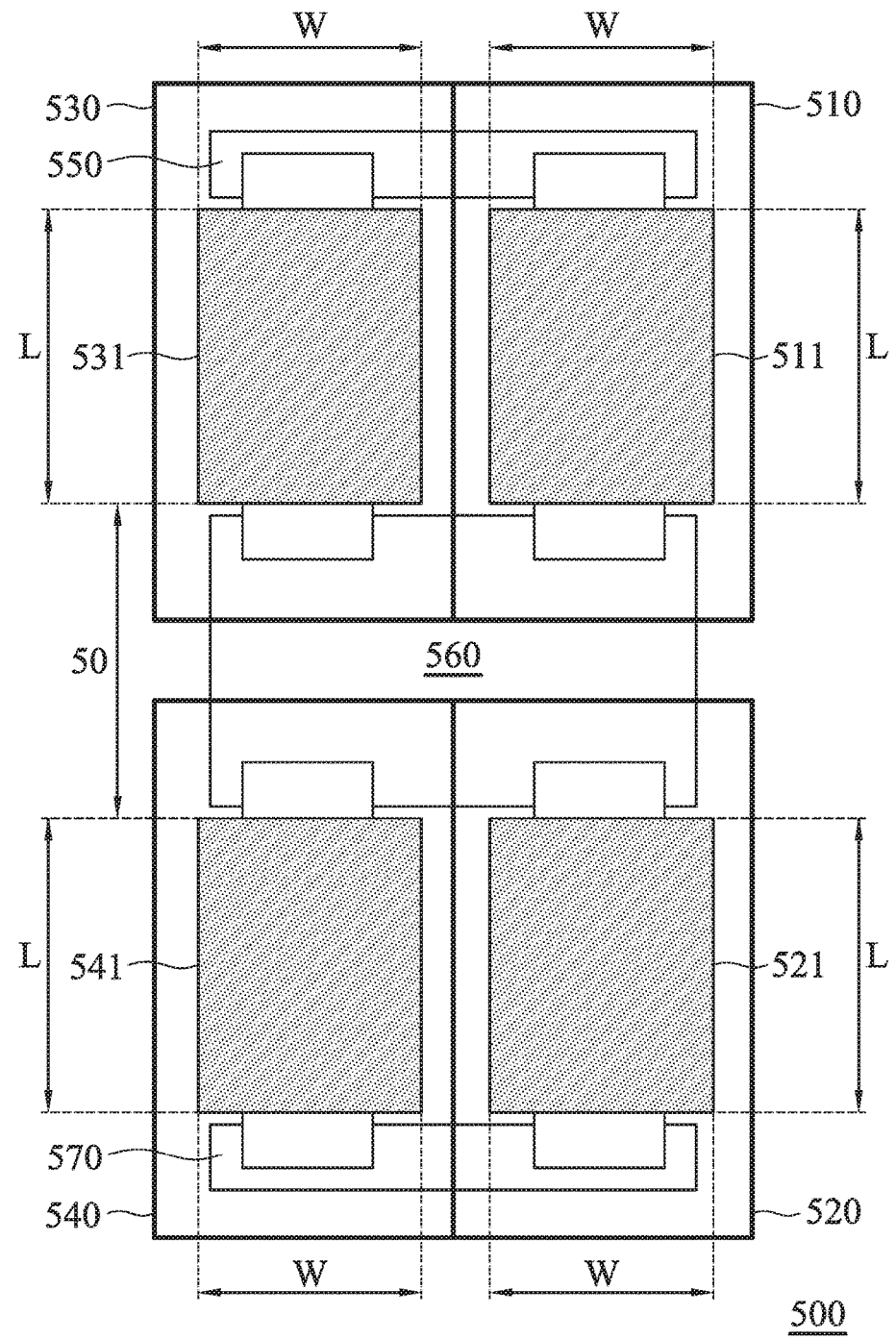
FIG. 5 is a layout diagram of a transistor in accordance with an embodiment of the invention.

FIG. 5 is a layout diagram of a transistor in accordance with an embodiment of the invention. According to an embodiment of the invention, the transistor could be employed in the current source described above, but not limited thereto. The design methods in the invention may be applied in any application when a transistor is required. As shown in FIG. 5, the current source unit 500 includes the first transistor 510, the second transistor 520, the third transistor 530, and the fourth transistor 540, in which the first transistor 510 and the second transistor 520 share the first source terminal 550 and the drain terminal 560. The third transistor 530 and the fourth transistor 540 share the second source terminal 570 and the drain terminal 560. According to other embodiments of the invention, the current source unit 500 may be constructed with any amount of transistors coupled in parallel, which is illustrated herein, but not limited thereto.

According to an embodiment of the invention, the first transistor 510, the second transistor 520, the third transistor 530, and the fourth transistor 540 respectively include the first poly silicon gate terminal 511, the second poly silicon gate terminal 521, the third poly silicon gate terminal 531, and the fourth poly silicon gate terminal 541, in which the length L of the first poly silicon gate terminal 511, the second poly silicon gate terminal 521, the third poly silicon gate terminal 531, and the fourth poly silicon gate terminal 541 exceeds the width W of the first poly silicon gate terminal 511, the second poly silicon gate terminal 521, the third poly silicon gate terminal 531, and the fourth poly silicon gate terminal 541. The first transistor 510, the second transistor 520, the third transistor 530, and the fourth transistor 540 are long-channel transistors. The gate terminal of each of the first transistor 510, the second transistor 520, the third transistor 530, and the fourth transistor 540 is made by a whole slice of poly silicon, but is not limited thereto. According to other embodiments of the invention, the length L does not exceed the width W.

According to an embodiment of the invention, the first source terminal 550 and the second source terminal 570 are coupled together by a metal wire. According to an embodiment of the invention, each of the first transistor 510, the second transistor 520, the third transistor 530, and the fourth transistor 540 may be a P-type transistor. According to another embodiment of the invention, each of the first transistor 510, the second transistor 520, the third transistor 530, and the fourth transistor 540 may be an N-type transistor. According to an embodiment of the invention, each of the least significant bits in FIGS. 3 and 4 is constructed by a predetermined amount of current source units 500, and the predetermined amount is a positive integer not less than 1.

As shown in FIG. 5, each of the first transistor 510, the second transistor 520, the third transistor 530, and the fourth transistor 540 is a long-channel transistor. Since the transistor with a long channel leads to a gradient in the poly silicon density, the gate space 50 must be increased to meet the requirement that the current density should be less than a predetermined value according to the design rule of a semiconductor process.

However, the larger the gate space 50 is, the larger the area of the current source unit 500 is. In addition, the gradient in the poly silicon density leads affects the electrical parameters of the transistor to lower the matching among the current source units, resulting in a larger output current offset among the current source units.

Figure 6:
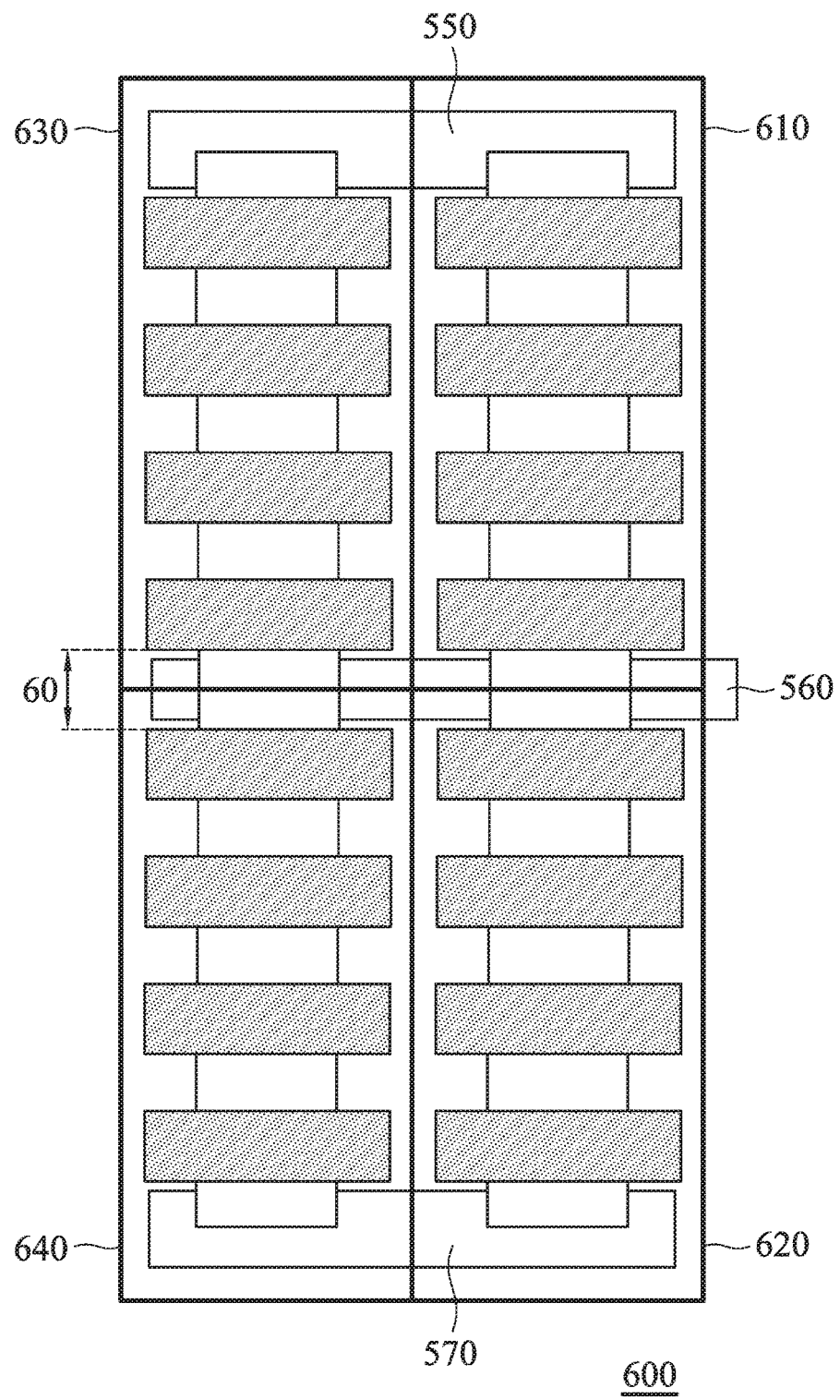
FIG. 6 is a layout diagram of a transistor in accordance with another embodiment of the invention.

FIG. 6 is a layout diagram of a transistor in accordance with another embodiment of the invention. According to an embodiment of the invention, the transistor could be employed in the current source described above, but it is not limited thereto. The design methods in the invention may be applied in any application when a transistor is required. As shown in FIG. 6, the circuit unit 600 includes the first transistor 610, the second transistor 620, the third transistor 630, and the fourth transistor 640. Four transistors coupled in series as shown in FIG. 6 is only for the convenience of explanation, but not limited thereto. The design method could be applied to any amount (including only 1) of transistors and could also be applied to the transistors coupled in series or in parallel. Each of the first transistor 610, the second transistor 620, the third transistor 630, and the fourth transistor 640 is constructed of 4 short-channel transistors coupled in series. According to an embodiment of the invention, a long-channel transistor is equivalent to four transistors coupled in series, leading to more uniform poly silicon density in the gate terminal. That is, a gate terminal is divided into four parts of poly silicon. The four short-channel transistors coupled in series which is illustrated in the embodiment is only for the purpose of explanation. In other embodiments, a long-channel transistor may be equivalent to several short-channel transistors coupled in series by the designer. That is, the gate terminal of a transistor is divided into several parts of poly silicon.

According to other embodiments of the invention, the gate terminals of the first transistor 610, the second transistor 620, the third transistor 630, and the fourth transistor 640 may be constructed by any other amount of poly silicon coupled in series, in which the amount is an integer not less than 2. The poly silicon density is made uniform by the transistor that is constructed of several short-channel transistors coupled in series, and the gate space 60 could not be deliberately increased as the gate space 50 in FIG. 5 to meet the design rule that the poly silicon density should be less than a predetermined value. The area of the circuit unit 600 is thus reduced.

In addition, due to the characteristic of a transistor and the layout method provided in the invention, the output impedance of the transistor should be increased by dividing the gate terminal of the transistor into several parts, such that the accuracy and the consistency of the output current from the transistor is thereby improved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A current source device, comprising:
   a plurality of current source units, arranged along a plurality of rows and a plurality of columns of a current source array, wherein each of the current source units comprises a first amount of sub-units, wherein each of the sub-units comprises a second amount of first-type transistors, wherein the first-type transistors are coupled in series with each other and the sub-units are coupled in parallel with each other;
   a plurality of least significant bits, wherein each of the least significant bits comprises a third amount of the current source units; and
   a plurality of most significant bits, wherein each of the most significant bits comprises a fourth amount of the current source units, wherein the fourth amount is the third amount multiplied by a positive integer, wherein each of the current source units is constructed by a fifth amount of the first-type transistors, such that a poly silicon density of the first-type transistor is uniform to reduce an influence of a gradient in the poly silicon density of the current source units and to increase an output impedance of each of the current source units.

2. The current source device of claim 1, wherein the fifth amount is the first amount multiplied by the second amount.

3. The current source device of claim 1, wherein the least significant bits are placed at a geometric center of the current source array, wherein two adjacent bits in the most significant bits are centrally symmetric to the geometric center.

4. The current source device of claim 3, wherein the current source array comprises a first symmetry axis through the geometric center, each of the most significant bits is divided into two parts, and the two parts are symmetric to the first symmetry axis.

5. The current source device of claim 4, wherein the current source array further comprises a second symmetry axis through the geometric center, wherein the second symmetry axis is orthogonal to the first symmetry axis and divides the current source array into a first region and a second region, wherein one of the two adjacent bits in the most significant bits is placed in one of the first region and the second region, and the other of the two adjacent bits in the most significant bits is placed in the other of the first region and the second region.

6. The current source device of claim 5, wherein the most significant bits are divided into a plurality of odd bits and a plurality of even bits, wherein the odd bits are in the first region, and the even bits are in the second region.

7. The current source device of claim 6, wherein each of the most significant bits is divided into a first part and a second part, wherein the first part and the second part are respectively placed in either side of the first symmetry axis.

8. The current source device of claim 7, wherein a first odd bit of the odd bits is adjacent to a first even bit of the even bits, wherein, when the first part and the second part of the first odd bit are coupled on the first symmetry axis and placed in the first region, the first part and the second part of the first even bit are separated from the first symmetry axis and placed in the second region.

9. The current source device of claim 7, wherein a first odd bit of the odd bits is adjacent to a first even bit of the even bits, wherein, when the first part and the second part of the first odd bit are separated from the first symmetry axis and placed in the first region, the first part and the second part of the first even bit are coupled on the first axis and placed in the second region.

10. The current source device of claim 5, wherein the first symmetry axis stretches along a direction of the rows, and the second symmetric axis stretches along a direction of the columns.

11. The current source device of claim 5, wherein the first symmetry axis stretches along a direction of the columns, and the second symmetric axis stretches along a direction of the rows.

12. The current source device of claim 3, wherein the current source array comprises N bits of thermometer codes and M bits of binary codes, wherein the positive integer is $(2^M-1)$, the amount of least significant bits is $(2^M-1)$, the amount of most significant bits is $(2^N-1)$, wherein the least significant bit and a plurality of dummy current source units form a least significant bit array placed in the geometric center, wherein the two adjacent bits in the most significant bits are centrally symmetric to the least significant bit array.

\* \* \* \* \*